(12) United States Patent
Lee et al.

(10) Patent No.: US 8,836,388 B2
(45) Date of Patent: Sep. 16, 2014

(54) SMART CARD CLOCK GENERATOR CIRCUITS WTH AUTONOMOUS OPERATION CAPABILITY AND METHOD OF OPERATING THE SAME

(71) Applicant: Samsung Electronics Co., Ltd., Suwon-si (KR)

(72) Inventors: Sang-Hyo Lee, Seoul (KR); Il-Jong Song, Yongin-si (KR); Jong-Pil Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/834,628

(22) Filed: Mar. 15, 2013

(65) Prior Publication Data

US 2013/0321049 A1    Dec. 5, 2013

(30) Foreign Application Priority Data

Jun. 1, 2012 (KR) .......................... 10-2012-0059355

(51) Int. Cl.
*H03L 7/06* (2006.01)
*H03L 7/08* (2006.01)

(52) U.S. Cl.
CPC ........................................ *H03L 7/08* (2013.01)
USPC ........................................... 327/156; 327/147

(58) Field of Classification Search
USPC .................. 327/147–149, 156–158
See application file for complete search history.

(56) References Cited

U.S. PATENT DOCUMENTS

| | | | |
|---|---|---|---|
| 5,334,952 A * | 8/1994 | Maddy et al. ................. | 331/1 A |
| 5,487,084 A * | 1/1996 | Lindholm ...................... | 375/215 |
| 6,628,172 B1 * | 9/2003 | Roth et al. ..................... | 331/1 A |
| 7,015,738 B1 * | 3/2006 | Cao ................................ | 327/159 |
| 7,406,297 B2 | 7/2008 | Osada | |
| 7,792,510 B2 * | 9/2010 | Pestryakov et al. ........... | 455/260 |
| 7,885,612 B2 | 2/2011 | Osada | |
| 8,102,948 B2 * | 1/2012 | Gau et al. ....................... | 375/326 |
| 8,531,219 B1 * | 9/2013 | Dunworth et al. ............. | 327/156 |
| 2003/0155949 A1 * | 8/2003 | Itkin et al. ..................... | 327/105 |
| 2008/0164918 A1 * | 7/2008 | Stockstad et al. .............. | 327/157 |
| 2008/0290916 A1 * | 11/2008 | Okada et al. .................. | 327/148 |
| 2009/0262877 A1 * | 10/2009 | Shi et al. ....................... | 375/376 |
| 2010/0197349 A1 | 8/2010 | Morita et al. | |
| 2011/0133796 A1 | 6/2011 | Osada | |
| 2013/0120036 A1 * | 5/2013 | Zhu et al. ...................... | 327/156 |
| 2013/0321049 A1 * | 12/2013 | Lee et al. ...................... | 327/156 |

FOREIGN PATENT DOCUMENTS

| | | | | |
|---|---|---|---|---|
| EP | 525963 A2 * | 2/1993 | ............. | G06F 13/42 |
| KR | 10-0557607 B1 | 2/2006 | | |

* cited by examiner

*Primary Examiner* — Adam Houston
(74) *Attorney, Agent, or Firm* — Myers Bigel Sibley & Sajovec, P.A.

(57) ABSTRACT

An apparatus includes a reference clock signal generator circuit configured to generate a reference clock signal in response to a carrier signal and a clock selection signal generator circuit configured to generate a clock selection signal in response to the carrier signal. The apparatus further includes a multiplexer (MUX) circuit configured to selectively output the reference clock signal and a PLL output clock signal in response to the clock selection signal and a phase-locked loop (PLL) circuit configured to receive the selectively output signal between the reference clock signal and the PLL output clock signal at a reference input thereof and to generate the PLL output clock signal therefrom. An ISO 14443 type A smart card may include such apparatus.

20 Claims, 9 Drawing Sheets

SMART CARD CLOCK GENERATOR CIRCUITS WTH AUTONOMOUS OPERATION CAPABILITY AND METHOD OF OPERATING THE SAME

CROSS-REFERENCE TO RELATED APPLICATION

This application claims priority under 35 U.S.C. §119 to Korean Patent Application No. 10-2012-0059355 filed Jun. 1, 2012, the disclosure of which is hereby incorporated herein by reference in its entirety.

FIELD

Embodiments of the inventive subject matter relate to clock generator circuits and methods of operating the same and, more particularly, to clock generator circuits for smart cards and methods of operating the same.

BACKGROUND

With the increase in integration density of semiconductor devices, various design and fabrication methods for increasing the area of a storage contact have been proposed.

An ISO 14443 type A smart card is configured to receive signals in an amplitude shift-keying (ASK) communication mode having a modulation index of 100%. Clock signals used in the smart card may be generated from carrier signals of radio-frequency (RF) signals received from a card reader. However, the RF signals received by the smart card may have a carrier frequency of about 13.56 MHz, and pause periods may be present between transmission bursts of the carrier signals. The carrier signal is absent during the pause period, making clock signal generation during the pause periods problematic. As a result, timing margin and frame delay time (FDT) margin required to restore signals may be reduced, which may cause communication failure.

SUMMARY

Some embodiments of the inventive subject matter provide an apparatus including a reference clock signal generator circuit configured to generate a reference clock signal in response to a carrier signal and a clock selection signal generator circuit configured to generate a clock selection signal in response to the carrier signal. The apparatus further includes a multiplexer (MUX) circuit configured to selectively output the reference clock signal and a PLL output clock signal in response to the clock selection signal and a phase-locked loop (PLL) circuit configured to receive the selectively output signal between the reference clock signal and the PLL output clock signal at a reference input thereof and to generate the PLL output clock signal therefrom. An ISO 14443 type A smart card may include such apparatus.

In some embodiments, the clock selection signal generator circuit may be configured to detect a presence and an absence of the carrier signal and to generate the clock selection signal responsive to the detected presence and absence of the carrier signal. The clock selection signal generator circuit may be configured to cause the MUX circuit to output the reference clock signal responsive to detecting presence of the carrier signal and to output the PLL output clock signal responsive to detecting absence of the carrier signal.

In some embodiments, the clock selection signal generator circuit may include a period detection circuit configured to generate a period detection signal responsive the carrier signal and a selection signal generator circuit configured to generate the clock selection signal responsive to the period detection signal. The period detection circuit may be configured to drive the period detection signal to a first state responsive to an envelope of the carrier signal decreasing to about 90% of a peak of the envelope and to drive the period detection signal to a second state responsive to the envelope of the carrier signal increasing to about 60% of the peak of the envelope. The selection signal generator circuit may be configured to cause the MUX circuit to apply the PLL output clock signal to the reference input of the PLL circuit responsive to the first state of the period detection signal and to cause the MUX circuit to apply the reference clock signal to the reference input of the PLL circuit responsive to the second state of the period detection signal. The selection signal generator circuit may be configured to delay transition of the clock selection signal responsive to the period detection signal transitioning to the second state for a predetermined number of clock cycles of the reference clock signal.

In further embodiments, the clock selection signal generator circuit may be configured to detect a normal period of the carrier signal and a pause period of the carrier signal using an envelope of the carrier signal, to drive the clock selection signal to a first state that causes the MUX circuit to output the reference clock signal in the normal period and to drive the clock selection signal to a second state that causes the MUX circuit to output the PLL output clock signal in the pause period. The clock selection signal generator circuit may be configured to drive the clock selection signal to the first state responsive to the envelope of the carrier signal reducing to about 90% of a peak of the envelope and to drive the clock selection signal to the second state responsive to the envelope of the carrier signal increasing to about 90% of the peak of the envelope.

Further embodiments of the inventive subject matter provide methods including generating a reference clock signal from a carrier signal, detecting a status of the carrier signal and selectively applying the reference clock signal and a PLL output clock signal of a PLL circuit to a reference input of the PLL circuit based on the detected status of the carrier signal. The methods may further include using the selectively applied signal between the reference clock signal and the PLL output clock signal as an input clock signal for a clocked circuit.

Selectively applying the reference clock signal and the PLL output clock signal to a reference input of the PLL circuit based on the detected status of the carrier signal may include generating a clock selection signal in response to the detected status and applying the clock selection signal to a MUX circuit configured to selectively output the reference clock signal and the PLL output clock signal. In some embodiments, selectively applying the reference clock signal and the PLL output clock signal to the reference input of the PLL circuit based on the detected status of the carrier signal may include applying the reference clock signal when the carrier signal is present and applying the PLL output clock signal when the carrier signal is absent. In still further embodiments, selectively applying the reference clock signal and the PLL output clock signal to the reference input of the PLL circuit based on the detected status of the carrier signal may include applying the PLL output clock signal responsive to an envelope of the carrier signal decreasing to about 90% of a peak of the envelope and applying the reference clock signal responsive to the envelope of the carrier signal increasing to about 60% of the peak of the envelope. The methods may be performed, for example, by an ISO 14443 type A smart card.

In additional embodiments of the inventive subject matter, an apparatus includes a reference clock signal generator circuit configured to generate a reference clock signal from a carrier signal, a PLL circuit configured to generate a PLL output clock signal, and a clock selection circuit configured to selectively apply the reference clock signal and the PLL output clock signal to the reference input of the PLL circuit based on a status of the carrier signal. The clock selection circuit may include a clock selection signal generator circuit configured to detect the status of the carrier signal and to responsively generate a clock selection signal and a MUX circuit configured to selectively apply the reference clock signal and the PLL output clock signal to the reference input of the PLL circuit responsive to the clock selection signal. The clock selection circuit may be configured to apply the PLL output clock signal to the reference input of the PLL circuit responsive to an envelope of the carrier signal decreasing to about 90% of a peak of the envelope and to apply the reference clock signal to the reference input of the PLL circuit responsive to the envelope of the carrier signal increasing to about 60% of the peak of the envelope. An ISO 14443 type A smart card may include such apparatus.

BRIEF DESCRIPTION OF THE DRAWINGS

The foregoing and other features and advantages of the inventive subject matter will be apparent from the more particular description of preferred embodiments of the inventive subject matters, as illustrated in the accompanying drawings in which like reference characters refer to the same parts throughout the different views. The drawings are not necessarily to scale, emphasis instead being placed upon illustrating the principles of the inventive subject matter. In the drawings.

DETAILED DESCRIPTION OF THE EMBODIMENTS

Example embodiments of the present invention are described below in sufficient detail to enable those of ordinary skill in the art to embody and practice the present invention. It is important to understand that the present invention may be embodied in many alternate forms and should not be construed as limited to the example embodiments set forth herein.

Accordingly, while the invention can be modified in various ways and take on various alternative forms, specific embodiments thereof are shown in the drawings and described in detail below as examples. There is no intent to limit the invention to the particular forms disclosed. On the contrary, the invention is to cover all modifications, equivalents, and alternatives falling within the spirit and scope of the appended claims. Elements of the example embodiments are consistently denoted by the same reference numerals throughout the drawings and detailed description.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

It should also be noted that in some alternative implementations, operations may be performed out of the sequences depicted in the flowcharts. For example, two operations shown in the drawings to be performed in succession may in fact be executed substantially concurrently or even in reverse of the order shown, depending upon the functionality/acts involved.

The inventive subject matter will now be described more fully with reference to the accompanying drawings, in which embodiments of the inventive subject matter are shown.

Figure 1:
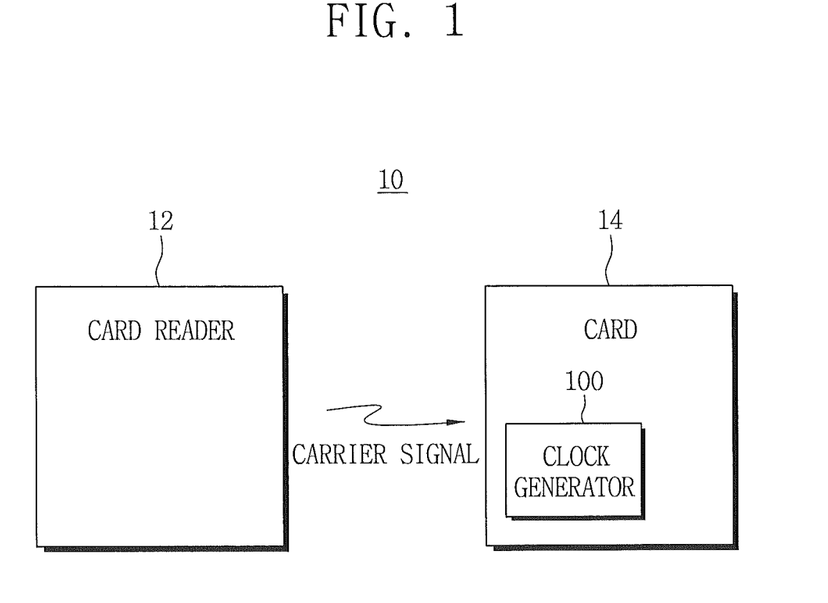
FIG. 1 is a block diagram of a smart card system using an apparatus according to some embodiments of the inventive subject matter.

FIG. 1 is a block diagram of a smart card system 10 using a clock generator circuit according to some embodiments of the inventive subject matter. The smart card system 10 may include a smart card reader 12 and a smart card 14 including a clock generator circuit 100.

The smart card reader 12 and the smart card 14 may communicate with each other according to the ISO 14443 Type A protocol. The smart card reader 12 may transmit a 13.56 MHz carrier signal to the smart card 14 in an ASK communication mode having a modulation index of 100% according to an international organization for standards (ISO) 14443 protocol. The smart card 14 may receive the 13.56 MHz carrier signal via an antenna included therein.

The clock generator circuit 100 may generate a clock signal in response to the received carrier signal. A frequency of the clock signal may be equal to or less than a frequency of the carrier signal. The smart card 14 may process data in response to the clock signal or another clock signal derived therefrom.

Figure 2:
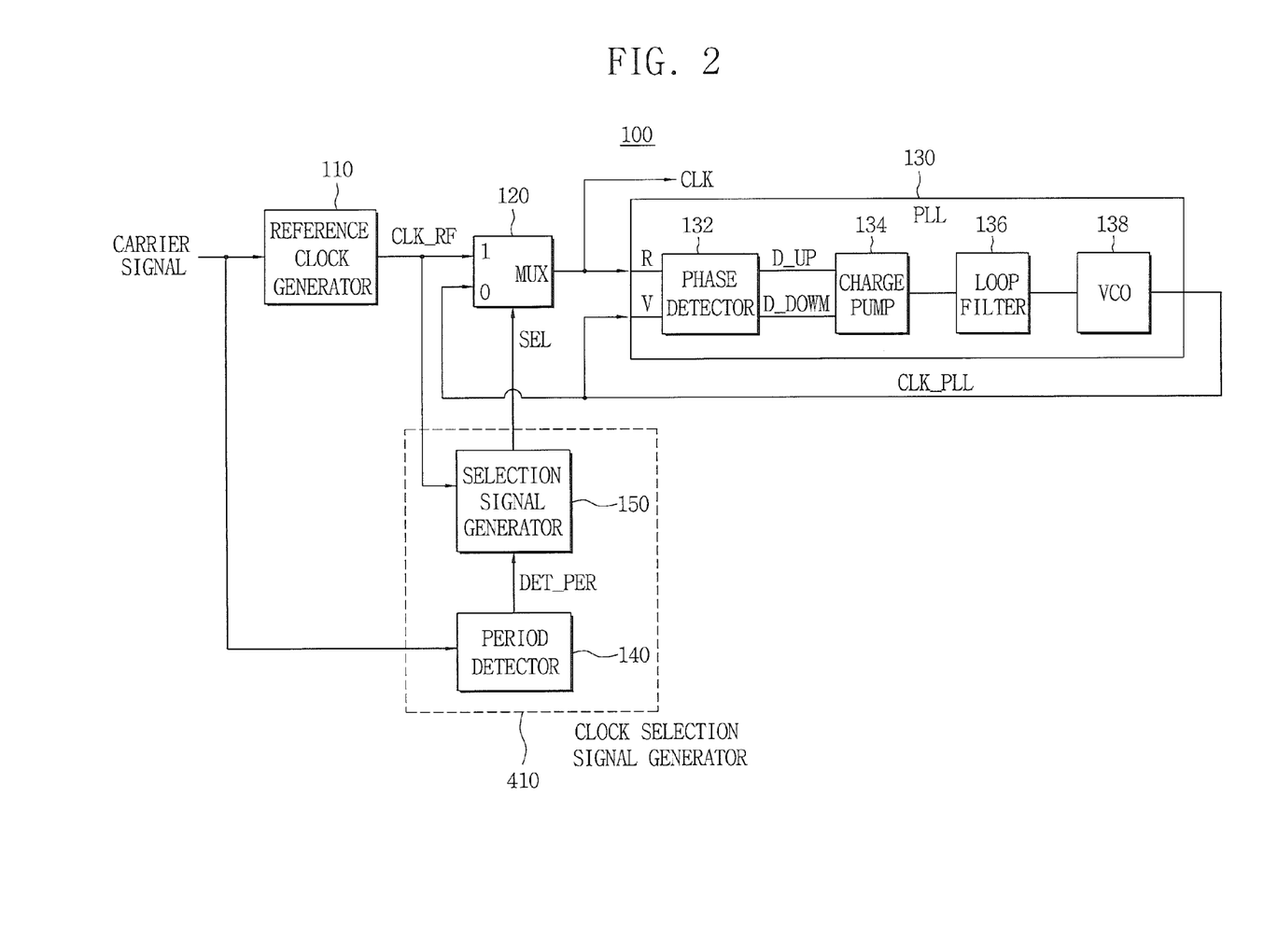
FIG. 2 is a block diagram of an apparatus according to some embodiments of the inventive subject matter.

FIG. 2 is a block diagram of a clock generator circuit 100 according to some embodiments of the inventive subject matter. Referring to FIG. 2, the clock generator circuit 100 may include a reference clock generator circuit 110, a multiplexer (MUX circuit) 120, a phase locked loop (PLL) 130 including a phase detector circuit 132, a charge pump circuit 134, a loop filter circuit 136, and a voltage-controlled oscillator (VCO circuit) 138, and a clock selection signal generator circuit 410 including a period detection circuit 140 and a selection signal generator circuit 150.

The reference clock generator circuit 110 may generate a reference clock signal CLK_RF having a frequency equal to the frequency of the carrier signal from the carrier signal received via the antenna included in the smart card 14, or a lower frequency obtained by dividing the frequency of the carrier signal by N. The reference clock generator circuit 110 outputs the generated reference clock signal CLK_RF to one input terminal of the MUX circuit 120.

The MUX circuit 120 receives the reference clock signal CLK_RF through one input terminal thereof, receives a PLL output clock signal CLK_PLL output by the PLL circuit 130 through another input terminal thereof, and outputs one of the reference clock signal CLK_RF or the PLL output clock signal CLK_PLL in response to a selection signal SEL output by the selection signal generator circuit 150.

The PLL circuit 130 receives the reference clock signal CLK_RF or the PLL output clock signal CLK_PLL output by the MUX circuit 120 through a reference terminal R thereof, receives the PLL output clock signal CLK_PLL output by the PLL circuit 130 through a feedback terminal V thereof, and generates and outputs a PLL output clock signal synchronized with the clock signal input to the reference terminal R.

The phase detector circuit 132 compares a phase of the clock signal input to the reference terminal R with a phase of the clock signal input to the feedback terminal V and generates a phase difference signal, here in the form of an up detection signal D_UP and a down detection signal D_DOWN. When the phase of the clock signal input to the feedback terminal V lags behind the phase of the clock signal input to the reference terminal R, the phase detector circuit 132 asserts the up detection signal D_UP corresponding to the phase difference therebetween. When the phase of the clock signal input to the feedback terminal V leads the phase of the clock signal input to the reference terminal R, the phase detector circuit 132 asserts the down detection signal D_DOWN corresponding to the phase difference therebetween.

The charge pump circuit 134 performs a charge pumping operation in response to the up detection signal D_UP output by the phase detector circuit 132, and supply charges to the loop filter circuit 134. The charge pump circuit 134 performs a charge sinking operation in response to the down detection signal D_DOWN, discharging charge stored in the loop filter circuit 136.

The loop filter circuit 136 generates an oscillation control voltage corresponding to charge charged or discharged by the charge pump circuit 134, and outputs the oscillation control voltage to the VCO circuit 138. When the loop filter circuit 136 is charged by the charge pump circuit 134, the oscillation control voltage may rise, while when charge is being discharged by the charge pump circuit 134, the oscillation control voltage may drop.

Thus, the charge pump circuit 134 and the loop filter circuit 136 generate an oscillation control voltage corresponding to the phase difference signal output by the phase detector circuit 132, and output the oscillation control voltage to the VCO circuit 138. The VCO circuit 138 generates and outputs a PLL output clock signal CLK_PLL having a frequency corresponding to the oscillation control voltage output by the loop filter circuit 136.

The clock selection signal generator circuit 410 may detect a normal period and a pause period of the carrier signal in response to the carrier signal and generate a clock selection signal to control the MUX circuit 120 to select and output a specific signal depending on a detected period state of the carrier signal. The period detection circuit 140 may receive the carrier signal received via the antenna, detect the normal and pause periods of the carrier signal, generate a period detection signal DET_PER indicating normal periods and pause periods, and output the period detection signal DET_PER to the selection signal generator circuit 150.

The period detection circuit 140 may detect a period in which an envelope of the received carrier signal departs from a normal state as the pause period. When a pause period is detected, the period detection circuit 140 may generate the period detection signal in a state indicating the pause period. The period detection circuit 140 may generate the period detection signal in a state indicating the normal period during the normal periods of the carrier signal.

For example, the period detection circuit 140 may identify a time point at which the envelope of the carrier signal decreases to 90% of a peak of the envelope as the beginning of a pause period, and may drive the period detection signal to a logic high. The period detection circuit 140 may identify a time point at which the envelope of the carrier signal increases to 60% of the peak of the carrier signal as an end to the pause period and the beginning of a normal period, and drive the period detection signal to a logic low. Thus, when the period detection circuit 140 outputs a logic-high signal, a pause period is indicated, and when the period detection circuit 140 outputs a logic-low signal, a normal period is indicated. In other embodiments, a period in which the period detection signal DET_PER is at a logic low may be identified as the pause period and a period in which the period detection signal DET_PER is at a logic high may be identified as the normal period.

The selection signal generator circuit 150 may receive the reference clock signal CLK_RF from the clock generator circuit 110, generate a selection signal SEL required to control the MUX circuit 120 to select and output one of the reference clock signal CLK_RF and the PLL output clock signal CLK_PLL, and output the selection signal SEL to the MUX circuit 120. For example, the selection signal generator circuit 150 may drive the output selection signal SEL to a logic high to select the reference clock signal CLK_RF, and to a logic low to select the PLL output clock signal CLK_PLL.

When the selection signal generator circuit 150 receives a period detection signal DET_PER indicating detection of the pause period from the period detection circuit 140, the selection signal generator circuit 150 may drive the output selection signal SEL to a logic low. When the selection signal generator circuit 150 receives a period detection signal DET_PER indicating a normal period from the period detection circuit 140, the selection signal generator circuit 150 may wait a number of cycles (e.g., 5) of the reference clock signal from time at which the normal period detection signal asserted, and then drive the output selection signal SEL to a logic high. The target clock signal CLK output from the MUX circuit 120 may be either the reference clock signal CLK_RF or the PLL output clock signal CLK_PLL output from the PLL circuit 130.

Figure 3:
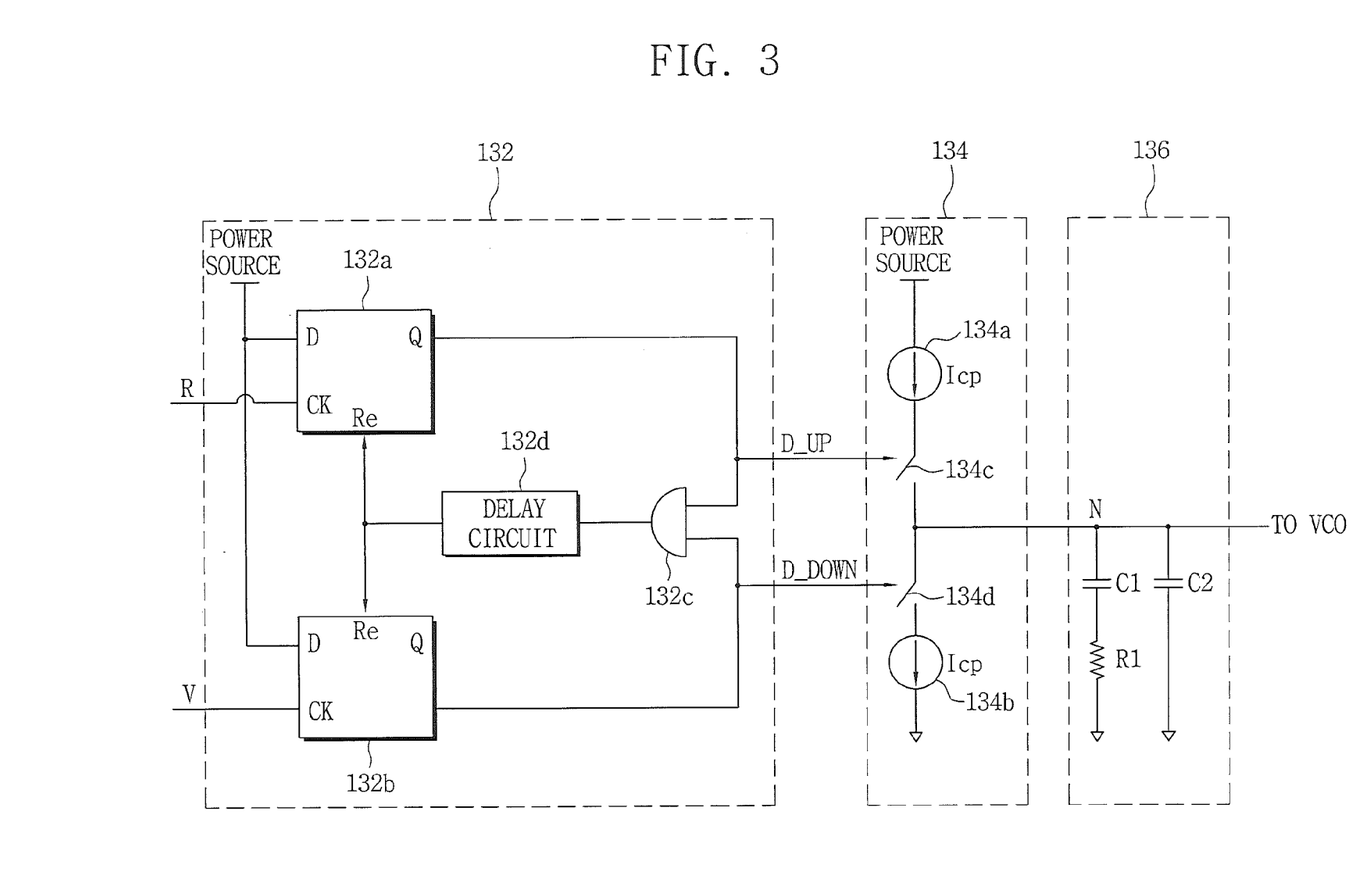
FIG. 3 is a circuit diagram of examples of a phase detector circuit, a charge pump circuit, and a loop filter circuit of a phase locked loop (PLL) used in an apparatus according to some embodiments of the inventive subject matter.

FIG. 3 is a circuit diagram of examples of the phase detector circuit 132, the charge pump circuit 134, and the loop filter circuit 136 of the PLL circuit 130 used in the clock generator circuit 100, according to some embodiments of the inventive subject matter.

Referring to FIG. 3, the phase detector circuit 132 may include a first D flip-flop 132a, a second D flip-flop 132b, an AND gate 132c, and a delay circuit 132d. The clock signal (the reference clock signal CLK_RF or the PLL output clock signal CLK_PLL) output by the MUX circuit 120 may be input to a clock input terminal CK of the first D flip-flop 132a, while the PLL output clock signal CLK_PLL output by the VCO circuit 138 of the PLL circuit 130 may be input to a clock input terminal CK of the second D flip-flop 132b. Data input terminals D of the D flip-flops 132a and 132b may be connected to a power source and receive logic high signals.

The data output terminals Q of the D flip-flops 132a and 132b may output an up detection signal D_UP and a down detection signal D_DOWN, respectively. The up detection signal D_UP may be asserted in response to a clock signal input to the reference terminal R having a phase that leads the phase of a clock signal input to the feedback terminal V. The down detection signal D_DOWN may be asserted with the clock signal input to the reference terminal R having a phase that trails the phase of the clock signal input to the feedback terminal V.

The AND gate 132c may receive the up detection signal D_UP and the down detection signal D_DOWN, and perform a logic AND on the up detection signal D_UP and the down detection signal D_DOWN. The delay circuit 132d may delay the output signal of the AND gate 132c for a predetermined time td, and transmit a reset signal to reset input terminals Re of the D flip-flips 132a and 132b.

The charge pump circuit 134 may include charge pump source sources 134a and 134b and switches 134c and 134d, which may be connected in series between the power source and circuit grounds. The charge pump current sources 134a and 134b may supply a charge pump current $I_{CP}$.

The switch 134c may receive the up detection signal D_UP and may turn on in response to a logic high level of the up detection signal D_UP, connecting the current source 134a to an output node N of the charge pump circuit 136. The switch 134d may receive the down detection signal D_DOWN and may turn on in response to a logic high level of the down detection signal D_DOWN, connecting the current source 134b to the output node N of the charge pump circuit 136.

The output signal of the AND gate 132c may be delayed for the predetermined time td using the delay circuit 132d to compensate for a dead zone of the charge pump circuit 134. The charge pump current sources 134a and 134b may require a predetermined amount of time to turn on and off, this time referred to as a dead zone because phase information regarding the up detection signal D_UP and the down detection signal D_DOWN are lost during the transition. The delaying of the output signal of the AND gate 132c for the predetermined time td may compensate for the dead zone.

The loop filter circuit 136 may include a first capacitor C1 and a resistor R1, which may be connected in series between the output node N and a circuit ground, and a second capacitor C2 connected between the output node N and another circuit ground. The first capacitor C1 may charge or discharge charges output by the charge pump circuit 134, and generate an oscillation control voltage. The resistor R1 may prevent a sharp variation in current flowing through the first capacitor C1. The second capacitor C2 may absorb an impulse current flowing when the PLL circuit 130 is locked, and have a capacitance far smaller than a capacitance of the first capacitor C1.

Figure 4:
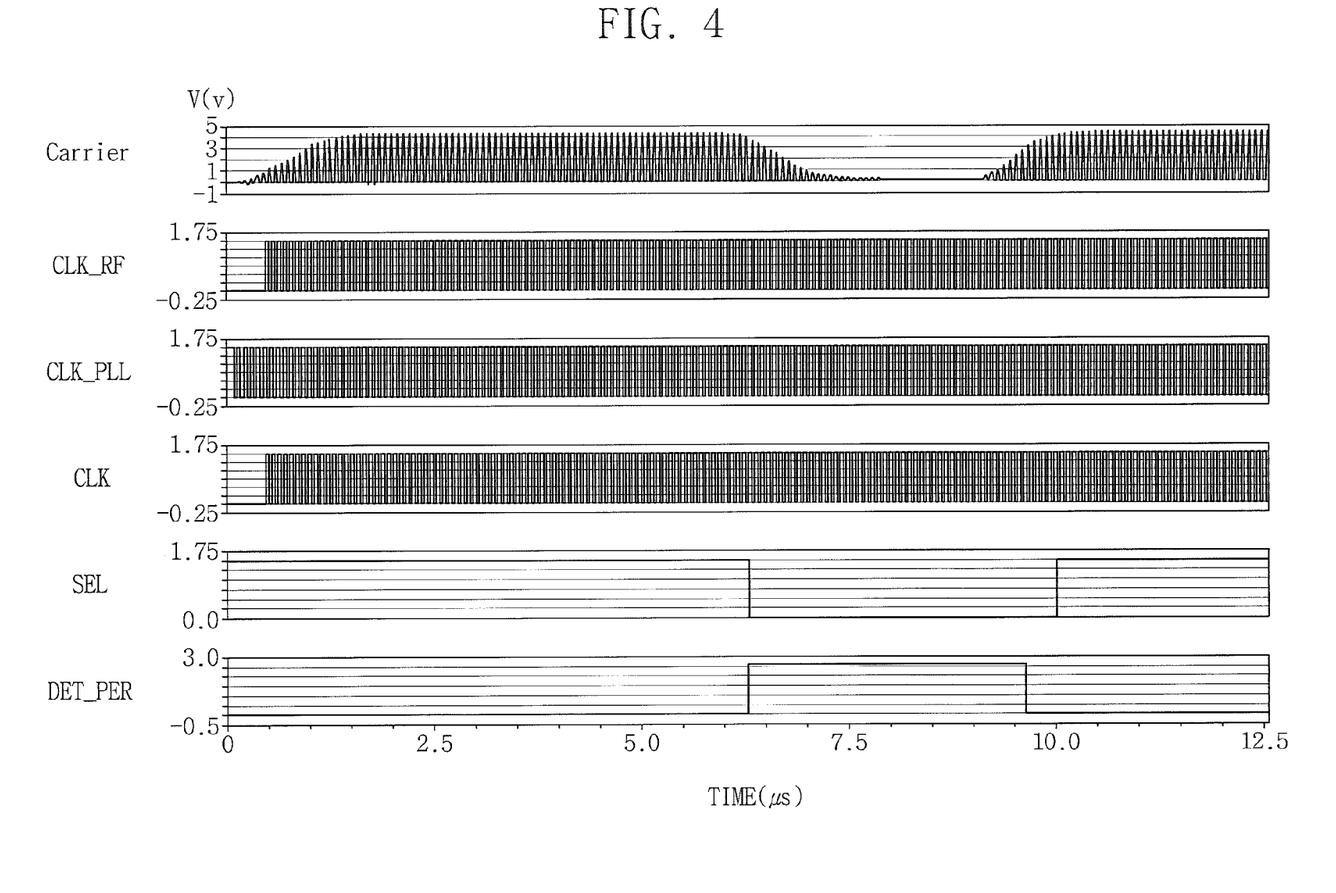
FIG. 4 is a signal timing diagram illustrating operations of an apparatus according to some embodiments of the inventive subject matter.

FIG. 4 is a signal timing diagram illustrating operations of a clock generator circuit according to some embodiments of the inventive subject matter. The reference clock signal CLK_RF, which is a clock signal generated using the 13.56 MHz carrier signal, may be absent or have a varied duty cycle during the pause period of the carrier signal according to an amplitude shift-keying (ASK) modulation index. In other words, the reference clock signal CLK_RF may be a clock signal distorted during the pause period.

The selection signal SEL, which is a signal configured to control the MUX circuit 120, may control the MUX circuit 120 to transmit the reference clock signal CLK_RF to the reference terminal R of the PLL circuit 130 not during the pause period but during the normal period. The selection signal SEL may control the MUX circuit 120 to transmit the PLL output clock signal corresponding to the output signal of the PLL circuit 130 to the reference terminal R of the PLL circuit 130 during the pause period or during a period in which it is determined that normal clock signals are not generated.

Figure 5:
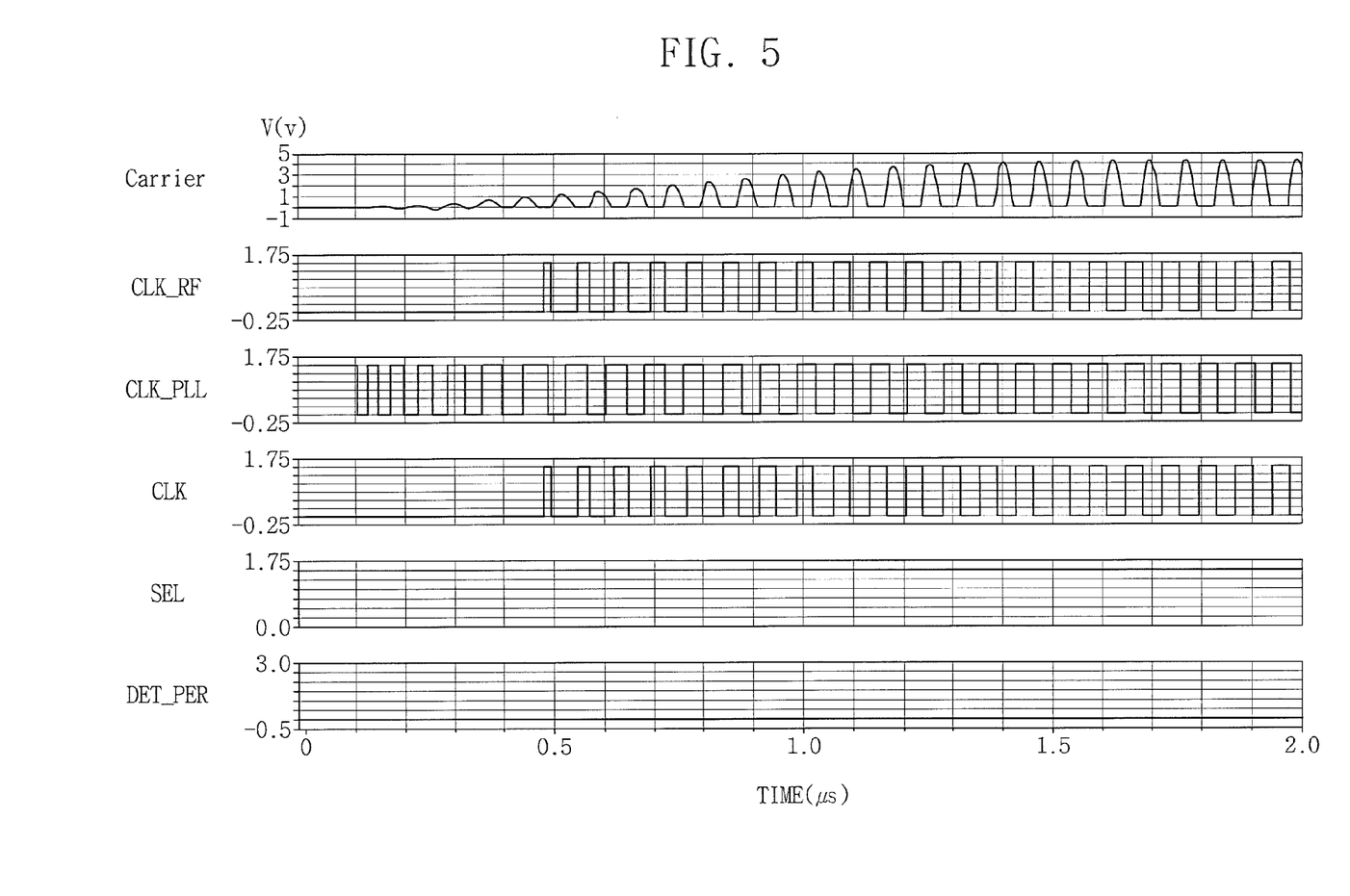
FIG. 5 is an enlarged view of a period of time between 0 μs and 2 μs in FIG. 4.
Figure 6:
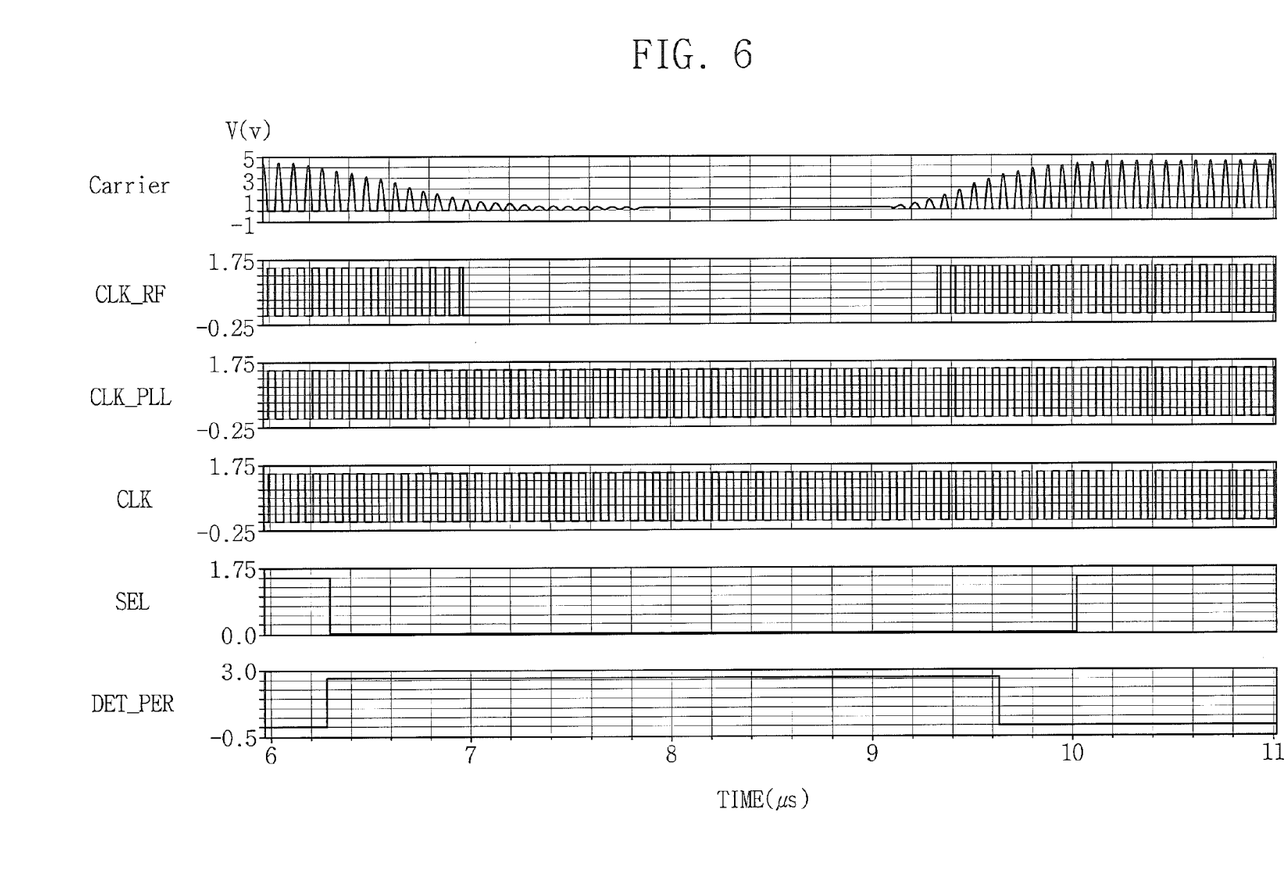
FIG. 6 is an enlarged view of a period of time between 6 μs and 11 μs in FIG. 4.

FIG. 4 is a timing diagram of each signal modulated in an ISO 14443 type A (106 kbps) 100% modulation mode. FIG. 5 is an enlarged view of a period of time between 0 μs and 2 μs in FIG. 4, and FIG. 6 is an enlarged view of a period of time between 6 μs and 11 μs in FIG. 4.

A card reader may transmit a normal carrier signal till the time point of 6 μs and transmit an ASK-modulated signal from the time point of 6 μs to the time point of 9 μs. Referring to FIG. 5, it can be seen that the PLL output clock signal CLK_PLL output by the PLL circuit 130 is settled within a time amount of about 2 μs. Referring to FIG. 6, the reference clock signal CLK_RF is not restored during a period of time between 6.97 μs and 9.33 μs. The period detection circuit 140 elevates the period detection signal DET_PER required to detect whether the period is the pause period, at a time point of 6.28 μs in which an envelope of the carrier signal descends and reaches 90% of the peak. The selection signal generator circuit 150 drops the selection signal SEL to a logic low in response to the period detection signal DET_PER being driven to a logic high, and the MUX circuit 120 outputs the PLL output clock signal CLK_PLL in response to the selection signal SEL being at a logic low.

The period detection circuit 140 may drive the period detection signal DET_PER to a logic low at a time point of 9.63 μs in which the envelope of the carrier signal rises and reaches 60% of the peak, the selection signal generator circuit 150 may start to count the number of input clocks of the reference clock signal CLK_RF in response to the period detection signal DET_PER being at a logic low, and elevate the selection signal SEL to a logic high at a time point of about 10.02 μs in which the counted number of input clocks is 5. In this case, this is because the reference clock signal CLK_RF is output as a normal clock signal with respect to the carrier signal after about five clock signals are generated. The MUX circuit 120 may output the reference clock signal CLK_RF in response to the selection signal SEL elevated to the logic high.

At a time point of 10.02 µs, the PLL output clock signal CLK_PLL may have a frequency of 13.61 MHZ, which lags behind the frequency (13.56 MHz) of the carrier signal by 0.4%. When an error is calculated in terms of the number of clocks counted during the entire period in which the selection signal SEL is at a logic high, a negligible error of 0.16 clocks may be obtained.

At a time point of 11 µs, the PLL output clock signal CLK_PLL may precisely run after the reference clock signal CLK_RF. Therefore, it can be seen that a settling time is less than 2 µm. A pause signal may occur at a time point of 15.43 µs. Thus, the settling time may have a sufficient margin.

It may be necessary to reduce settling time of a signal with a high data rate. By increasing a charge pump current $I_{CP}$ of the PLL circuit 130, settling time may be reduced. In the present example, a settling time of less than 2 µs was obtained at a charge pump current $I_{CP}$ of 10 mA, while a settling time of less than 1.6 µs was obtained at a charge pump current $I_{CP}$ of 12 mA.

Figure 7:
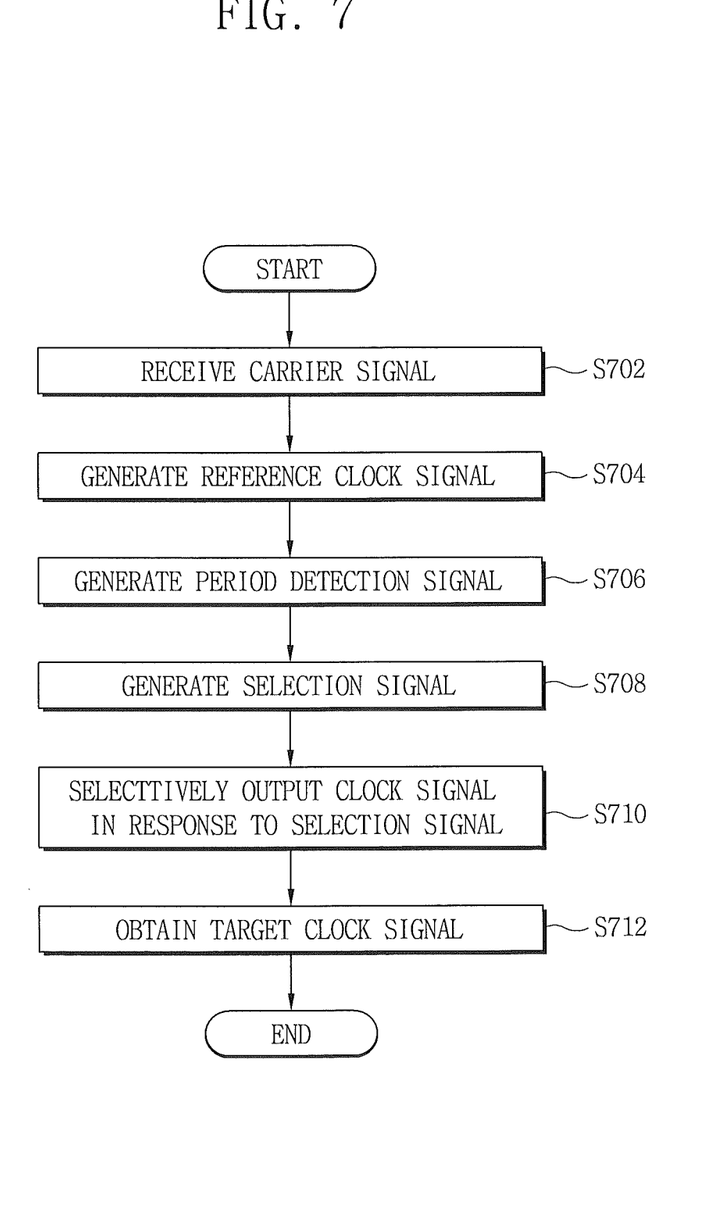
FIG. 7 is a flowchart illustrating operations for generating clock signals according to some embodiments of the inventive subject matter.

FIG. 7 is a flowchart illustrating operations for generating clock signals according to some embodiments of the inventive subject matter. A carrier signal received via the antenna may be received by the reference clock generator circuit 110 and the period detection circuit 140 (operation S702). The reference clock generator circuit 110 may generate a reference clock signal CLK_RF having a frequency equal to the frequency of the carrier signal or having 1/N the frequency of the carrier signal using the received carrier signal, and output the generated reference clock signal CLK_RF to the MUX circuit 120 and the selection signal generator circuit 150 (operation S704).

The period detection circuit 140 may determine whether the carrier signal is in the normal period or the pause period using the received carrier signal, and generate a period detection signal DET_PER based on the determination result (operation S706). The selection signal generator circuit 150 may generate a selection signal SEL in response to the period detection signal DET_PER, and output the selection signal SEL to the MUX circuit 120 (operation S708). In this case, when the period detection signal DET_PER indicates that the carrier signal is in the pause period, the selection signal generator circuit 150 may immediately generate the selection signal SEL. Also, when the period detection signal DET_PER indicates that the carrier signal is in the normal period, the selection signal generator circuit 150 may generate the selection signal SEL after five clock periods of the reference clock signal.

Thereafter, the MUX circuit 120 may select the reference clock signal CLK_RF or the PLL output clock signal CLK_PLL output by the PLL circuit 130 in response to the selection signal SEL and output the selected signal (operation S710). The selection signal SEL may control the MUX circuit 120 to output the reference clock signal CLK_RF when the carrier signal is in the normal period, and control the MUX circuit 120 to output the PLL output clock signal CLK_PLL when the carrier signal is in the pause period. The output signal output by the MUX circuit 120 may be obtained as a target clock signal (operation S712).

Figure 8:
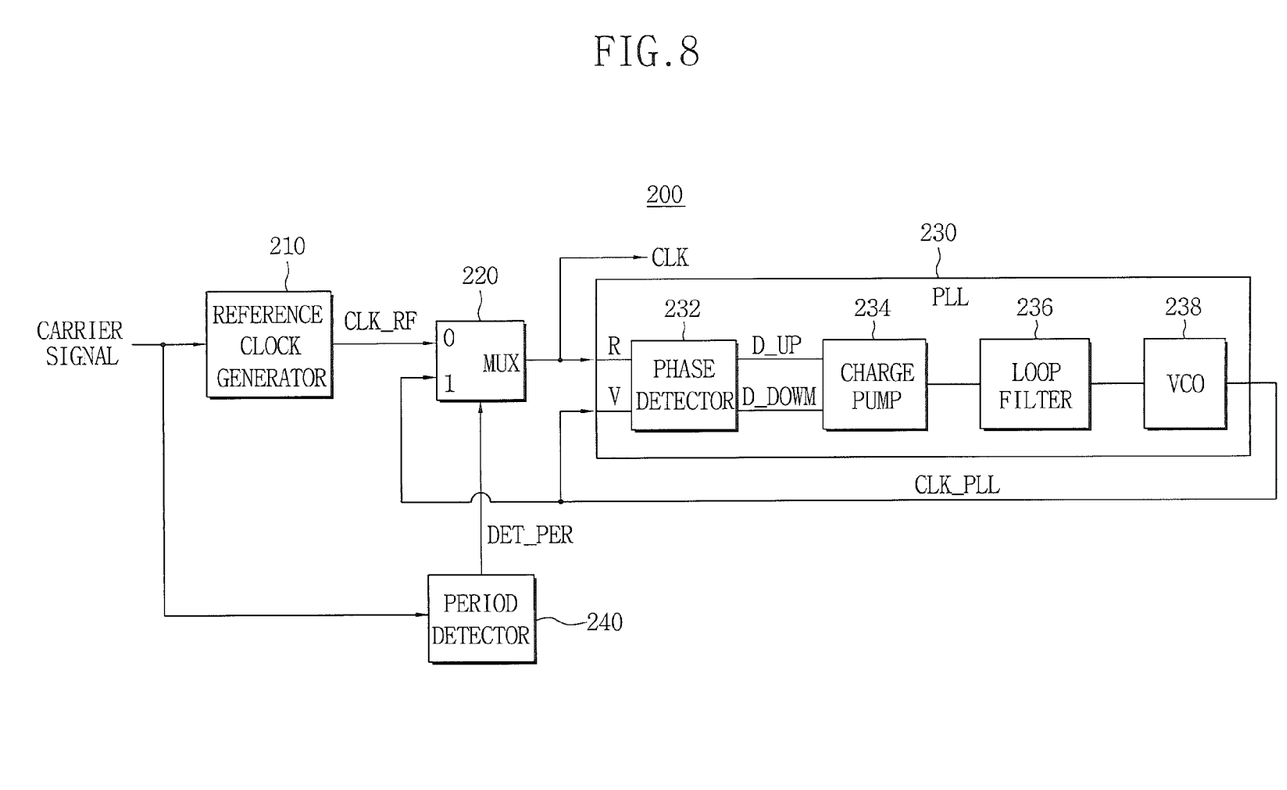
FIG. 8 is a block diagram of an apparatus according to further embodiments of the inventive subject matter.

FIG. 8 is a block diagram of a clock generator circuit 200 according to further embodiments of the inventive subject matter. Referring to FIG. 8, the clock generator circuit 200 may include a reference clock generator circuit 210, a MUX circuit 220, a PLL circuit 230, and a period detection circuit 240. Among these, the reference clock generator circuit 210 and the PLL circuit 230 may perform the same functions as the reference clock generator circuit 110 and the PLL circuit 130 described with reference to FIG. 2, and thus repeated detailed description thereof will be omitted.

The MUX circuit 220 may receive the reference clock signal CLK_RF output by the reference clock generator circuit 210 and the PLL output clock signal CLK_PLL output by the PLL circuit 230 and output one of the reference clock signal CLK_RF and the PLL output clock signal CLK_PLL in response to the period detection signal DET_PER output by the period detection circuit 240. In particular, the MUX circuit 220 may output the reference clock signal CLK_RF when the period detection signal DET_PER indicates a normal period (e.g., a logic low), and output the PLL output clock signal CLK_PLL when the period detection signal DET_PER indicates a pause period (e.g., a logic high).

The period detection circuit 240 may receive a carrier signal via an antenna, detect whether the carrier signal is in a normal period or a pause period, generate a period detection signal DET_PER indicating the normal period or the pause period, and output the generated period detection signal DET_PER to the MUX circuit 220. The period detection circuit 240 may detect a period in which an envelope of the received carrier signal departs from a normal state as the pause period. When the pause period is detected, the period detection circuit 240 may generate the period detection signal DET_PER indicating the pause period, and output the period detection signal DET_PER to the MUX circuit 220.

For instance, the period detection circuit 240 may determine that a time point in which the envelope of the carrier signal descends and reaches 90% of a peak of the carrier signal as a time point in which the pause period starts, and elevate the period detection signal DET_PER to a logic high. The period detection circuit 140 may determine that a time point in which the envelope of the carrier signal ascends and reaches 90% of the peak of the carrier signal as a time point in which the pause period ends and the normal period starts, and drop the period detection signal DET_PER to a logic low. When the period detection signal is at the logic high, the pause period may be indicated, while when the period detection signal is at the logic low, the normal period may be indicated.

In the above-described example, since a stable reference clock signal is already being generated at the time point in which the envelope of the carrier signal ascends and reaches 90% of the peak, the MUX circuit 220 may be allowed to output the reference clock signal CLK_RF at the time point. In some embodiments, a period in which the period detection signal DET_PER is at the logic low may be set as the pause period.

Figure 9:
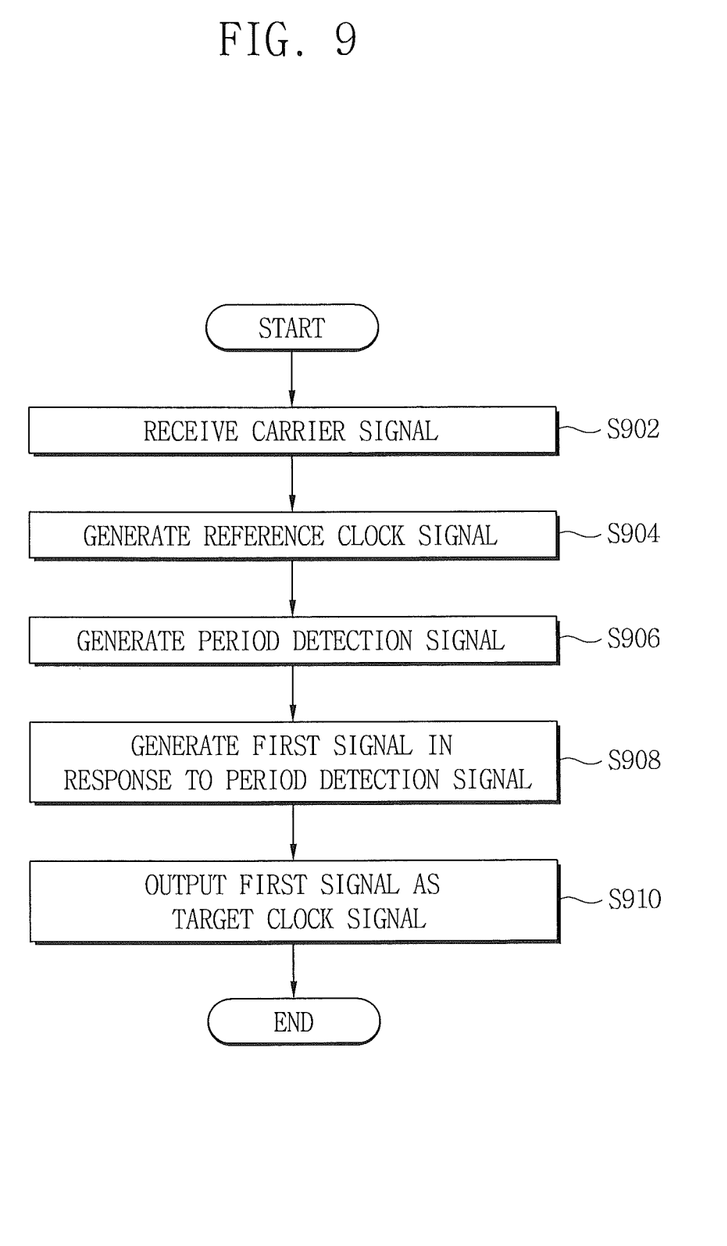
FIG. 9 is a flowchart illustrating operations for generating clock signals according to further embodiments of the inventive subject matter.

FIG. 9 is a flowchart illustrating operations for generating clock signals according to further embodiments of the inventive subject matter. The clock generator circuit 210 and the period detection circuit 240 may receive a carrier signal (operation S902). The clock generator circuit 210 may generate a reference clock signal in response to the carrier signal (operation S904). The period detection circuit 240 may detect whether the carrier signal is in the normal period or pause period in response to the carrier signal, and generate the period detection signal DET_PER indicating whether the carrier signal is in the normal period or the pause period (operation S906). The MUX circuit 220 may select the reference clock signal CLK_RF or the output signal of the PLL circuit 130 in response to the period detection signal DET_PER, and generate a first signal (operation S908). The clock generator circuit 200 may output the first signal generated by the MUX circuit 220 as a target clock signal (operation S910).

The present inventive subject matter may be applied to a clock generator circuit, particularly, in applications such as apparatus for generating clock signals using a carrier signal in an ASK modulation mode.

According to some embodiments of the inventive subject matter, reduced distortion clock signals can be generated even during a pause period of carrier signals using a PLL circuit and a MUX circuit, thereby obviating occurrence of communication failure in a smart card and improving reliability of signal processing operations.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive subject matter as defined in the claims. In the claims, means-plus-function clauses are intended to cover the structures described herein as performing the recited function, and not only structural equivalents but also equivalent structures.

What is claimed is:

1. An apparatus comprising:
   a reference clock signal generator circuit configured to generate a reference clock signal in response to a carrier signal;
   a clock selection signal generator circuit configured to generate a clock selection signal in response to the carrier signal;
   a multiplexer (MUX) circuit configured to selectively output the reference clock signal and a PLL output clock signal in response to the clock selection signal; and
   a phase-locked loop (PLL) circuit configured to receive the selectively output signal between the reference clock signal and the PLL output clock signal at a reference input thereof and to generate the PLL output clock signal therefrom.

2. The apparatus of claim 1, wherein the clock selection signal generator circuit is configured to detect a presence and an absence of the carrier signal and to generate the clock selection signal responsive to the detected presence and absence of the carrier signal.

3. The apparatus of claim 2, wherein the clock selection signal generator circuit is configured to cause the MUX circuit to output the reference clock signal responsive to detecting presence of the carrier signal and to output the PLL output clock signal responsive to detecting absence of the carrier signal.

4. The apparatus of claim 1, wherein the clock selection signal generator circuit comprises:
   a period detection circuit configured to generate a period detection signal responsive the carrier signal; and
   a selection signal generator circuit configured to generate the clock selection signal responsive to the period detection signal.

5. The apparatus of claim 4:
   wherein the period detection circuit is configured to drive the period detection signal to a first state responsive to an envelope of the carrier signal decreasing to about 90% of a peak of the envelope and to drive the period detection signal to a second state responsive to the envelope of the carrier signal increasing to about 60% of the peak of the envelope;
   wherein the selection signal generator circuit is configured to cause the MUX circuit to apply the PLL output clock signal to the reference input of the PLL circuit responsive to the first state of the period detection signal and to cause the MUX circuit to apply the reference clock signal to the reference input of the PLL circuit responsive to the second state of the period detection signal.

6. The apparatus of claim 5, wherein the selection signal generator circuit is configured to delay transition of the clock selection signal responsive to the period detection signal transitioning to the second state for a predetermined number of clock cycles of the reference clock signal.

7. An ISO 14443 type A smart card including the apparatus of claim 3.

8. The apparatus of claim 1, wherein the clock selection signal generator circuit is configured to detect a normal period of the carrier signal and a pause period of the carrier signal using an envelope of the carrier signal, to drive the clock selection signal to a first state that causes the MUX circuit to output the reference clock signal in the normal period and to drive the clock selection signal to a second state that causes the MUX circuit to output the PLL output clock signal in the pause period.

9. The apparatus of claim 8, wherein the clock selection signal generator circuit is configured to drive the clock selection signal to the first state responsive to the envelope of the carrier signal reducing to about 90% of a peak of the envelope and to drive the clock selection signal to the second state responsive to the envelope of the carrier signal increasing to about 90% of the peak of the envelope.

10. An ISO 14443 type A smart card comprising the apparatus of claim 8.

11. A method comprising:
    generating a reference clock signal from a carrier signal;
    detecting a status of the carrier signal; and
    selectively applying the reference clock signal and a PLL output clock signal of a PLL circuit to a reference input of the PLL circuit based on the detected status of the carrier signal.

12. The method of claim 11, further comprising using the selectively applied signal between the reference clock signal and the PLL output clock signal as an input clock signal for a clocked circuit.

13. The method of claim 11, wherein selectively applying the reference clock signal and the PLL output clock signal to a reference input of the PLL circuit based on the detected status of the carrier signal comprises:
    generating a clock selection signal in response to the detected status; and
    applying the clock selection signal to a MUX circuit configured to selectively output the reference clock signal and the PLL output clock signal.

14. The method of claim 11, wherein selectively applying the reference clock signal and the PLL output clock signal to the reference input of the PLL circuit based on the detected status of the carrier signal comprises applying the reference clock signal when the carrier signal is present and applying the PLL output clock signal when the carrier signal is absent.

15. The method of claim 11, wherein selectively applying the reference clock signal and the PLL output clock signal to the reference input of the PLL circuit based on the detected status of the carrier signal comprises applying the PLL output clock signal responsive to an envelope of the carrier signal decreasing to about 90% of a peak of the envelope and applying the reference clock signal responsive to the envelope of the carrier signal increasing to about 60% of the peak of the envelope.

16. The method of claim 11, performed by an ISO 14443 type A smart card.

17. An apparatus comprising:
- a reference clock signal generator circuit configured to generate a reference clock signal from a carrier signal;
- a PLL circuit configured to generate a PLL output clock signal; and
- a clock selection circuit configured to selectively apply the reference clock signal and the PLL output clock signal to a reference input of the PLL circuit based on a status of the carrier signal.

18. The apparatus of claim 17, wherein the clock selection circuit comprises:
- a clock selection signal generator circuit configured to detect the status of the carrier signal and to responsively generate a clock selection signal; and
- a MUX circuit configured to selectively apply the reference clock signal and the PLL output clock signal to the reference input of the PLL circuit responsive to the clock selection signal.

19. The apparatus of claim 17, wherein the clock selection circuit is configured to apply the PLL output clock signal to the reference input of the PLL circuit responsive to an envelope of the carrier signal decreasing to about 90% of a peak of the envelope and to apply the reference clock signal to the reference input of the PLL circuit responsive to the envelope of the carrier signal increasing to about 60% of the peak of the envelope.

20. An ISO 14443 type A smart card comprising the apparatus of claim 17.

* * * * *